(12) United States Patent
Elia et al.

(10) Patent No.: US 8,367,170 B2
(45) Date of Patent: Feb. 5, 2013

(54) VEHICULAR ELECTRICAL AND ELECTRONIC HOUSINGS

(75) Inventors: Andri E. Elia, Chadds Ford, PA (US); Michael R. Day, Bloomfield Hills, MI (US); Gino Palumbo, Toronto (CA); Jonathan McCrea, Toronto, CA (US)

(73) Assignee: Integran Technologies, Inc., Ontario (CA)

( * ) Notice: Subject to any disclaimer, the term of this patent is extended or adjusted under 35 U.S.C. 154(b) by 280 days.

(21) Appl. No.: 12/681,355

(22) PCT Filed: Oct. 1, 2008

(86) PCT No.: PCT/US2008/011339
§ 371 (c)(1),
(2), (4) Date: Apr. 1, 2010

(87) PCT Pub. No.: WO2009/045416
PCT Pub. Date: Apr. 9, 2009

(65) Prior Publication Data
US 2010/0239801 A1    Sep. 23, 2010

Related U.S. Application Data

(60) Provisional application No. 60/997,638, filed on Oct. 4, 2007.

(51) Int. Cl.
*B32B 1/02* (2006.01)
*B32B 1/08* (2006.01)

(52) U.S. Cl. ............ 428/35.8; 428/34.1; 428/34.2; 428/35.7; 428/35.9; 428/36.9

(58) Field of Classification Search ............ 428/34.1, 428/34.2, 35.7, 35.9, 36.9, 35.8
See application file for complete search history.

(56) References Cited

U.S. PATENT DOCUMENTS

| | | | |
|---|---|---|---|
| 3,544,432 A * | 12/1970 | Teiji et al. ............ 205/167 |
| 4,078,445 A | 3/1978 | Kiser, Jr. |
| 4,118,372 A | 10/1978 | Schaefgen |
| 4,306,489 A | 12/1981 | Driver et al. |
| 4,349,421 A * | 9/1982 | Khattab ............ 205/168 |
| 4,377,647 A | 3/1983 | Durbin et al. |
| 4,406,558 A | 9/1983 | Kochendorfer et al. |
| 4,552,626 A * | 11/1985 | Stevenson ............ 205/168 |
| 4,681,712 A * | 7/1987 | Sakakibara et al. ...... 264/440 |
| 4,753,456 A | 6/1988 | Booher |
| 4,851,271 A | 7/1989 | Moore, III et al. |
| 5,087,657 A | 2/1992 | Qureshi et al. |
| 5,324,766 A | 6/1994 | Ikejiri et al. |
| 5,352,266 A | 10/1994 | Erb et al. |
| 5,433,797 A | 7/1995 | Erb et al. |
| 5,899,778 A | 5/1999 | Hiraoka et al. |
| 6,235,408 B1 | 5/2001 | Tamura et al. |
| 6,536,566 B2 | 3/2003 | Hasegawa et al. |
| 6,595,341 B1 | 7/2003 | Venz |
| 6,598,581 B2 | 7/2003 | Kempf |
| 6,832,587 B2 | 12/2004 | Wampula et al. |
| 6,846,261 B2 | 1/2005 | Lev et al. |
| 7,320,832 B2 * | 1/2008 | Palumbo et al. ............ 428/548 |
| 7,553,553 B2 * | 6/2009 | Palumbo et al. ............ 428/626 |
| 8,247,050 B2 * | 8/2012 | McCrea et al. ............ 428/35.8 |
| 2001/0053541 A1 | 12/2001 | Su et al. |
| 2002/0072335 A1 | 6/2002 | Watanabe |
| 2004/0005473 A1 | 1/2004 | Matteucci et al. |
| 2004/0129112 A1 * | 7/2004 | Gillis et al. ............ 75/252 |
| 2004/0152808 A1 * | 8/2004 | Tezuka et al. ............ 524/127 |
| 2004/0197212 A1 | 10/2004 | Roby |
| 2004/0242737 A1 | 12/2004 | Topulos |
| 2005/0049096 A1 | 3/2005 | Eck |
| 2005/0051933 A1 | 3/2005 | Platner et al. |
| 2005/0186438 A1 | 8/2005 | Alms et al. |
| 2005/0199203 A1 | 9/2005 | Stein |
| 2005/0205425 A1 | 9/2005 | Palumbo et al. |
| 2005/0225485 A1 | 10/2005 | Aisenbrey |
| 2006/0125282 A1 | 6/2006 | Theuerkauf |
| 2006/0135282 A1 | 6/2006 | Palumbo et al. |
| 2006/0229416 A1 | 10/2006 | Walker et al. |
| 2006/0292385 A1 | 12/2006 | Renekn et al. |
| 2007/0173619 A1 | 7/2007 | Yu et al. |
| 2007/0203271 A1 | 8/2007 | Alms et al. |
| 2008/0312403 A1 | 12/2008 | Stockel et al. |

FOREIGN PATENT DOCUMENTS

| | | |
|---|---|---|
| DE | 7719322 | 1/1978 |
| DE | 3606052 | 7/1986 |
| DE | 19909191 | 9/2000 |
| DE | 10238517 | 10/2003 |
| WO | 2005120798 | 12/2005 |
| WO | 2006063469 | 6/2006 |
| WO | 2006114429 | 11/2006 |
| WO | 2007089585 | 8/2007 |

OTHER PUBLICATIONS

International Search Report of PCT/US2008/011339 dated Dec. 11, 2008.
International Search Report for PCT/US2008/011339; Dated Apr. 7, 2010.
Extended European Search Report of PCT/US2008/011339 dated May 4, 2012.
Extended European Search Report of European Application No. 08836654.7 dated Apr. 7, 2011.
International Search Report for PCT/US2008/011363 dated Apr. 7, 2010.
International Search Report for PCT/US2008/011363 dated Dec. 12, 2008.

(Continued)

*Primary Examiner* — Marc Patterson

(74) *Attorney, Agent, or Firm* — Rankin Hill & Clark LLP

(57) ABSTRACT

Metal plated organic polymer compositions are useful as vehicular electronic and electrical housings. Such housings may have lighter weight, better strength and/or stiffer and may be more easily made than conventional housings.

19 Claims, No Drawings

OTHER PUBLICATIONS

International Search Report for PCT/US2008/011364 dated Apr. 7, 2010.
International Search Report for PCT/US2008/011364 dated Dec. 12, 2008.
International Search Report for PCT/US2008/011337 dated Apr. 4, 2010.
International Search Report for PCT/US2008/011337 dated Dec. 5, 2008.
International Search Report for PCT/US2008/011355 dated Apr. 7, 2010.
International Search Report for PCT/US2008/011355 dated Dec. 5, 2008.
International Search Report for PCT/US2008/011351 dated Apr. 7, 2010.
International Search Report for PCT/US2008/011351 dated Dec. 2, 2008.
Office Action of U.S. Appl. No. 12/681,351 dated Nov. 23, 2011.
Office Action of U.S. Appl. No. 12/681,351 dated May 9, 2012.
Office Action of U.S. Appl. No. 12/681,354 dated Mar. 14, 2012.
Office Action of U.S. Appl. No. 12/681,357 dated Jan. 5, 2012.
Final Office Action of U.S. Appl. No. 12/681,354 dated Jul. 6, 2012, fourteen pages.
Office Action of U.S. Appl. No. 12/681,354 dated Sep. 7, 2012.
Office Action of U.S. Appl. No. 12/681,351 dated Oct. 25, 2012.
Office Action of U.S. Appl. No. 12/681,353 dated Oct. 11, 2012.

* cited by examiner

VEHICULAR ELECTRICAL AND ELECTRONIC HOUSINGS

FIELD OF THE INVENTION

Organic polymers which are metal plated are useful for vehicular electrical and electronic housings.

TECHNICAL BACKGROUND

Vehicles such as automobiles, trucks, motorcycles, scooters, recreational and all terrain vehicles, farm equipment such as tractors, and construction equipment such as bulldozers and graders are of course important items in modern society, and they are made of a myriad of parts. Also important are stationary internal combustion engines such as those used to power generators. Many of these parts must have certain minimum physical properties such as stiffness and/or strength. Traditionally these types of parts have been made from metals such as steel, aluminum, zinc, and other metals, but in recent decades organic polymers have been increasingly used for such parts for a variety of reasons. Such polymeric parts are often lighter, and/or easier (cheaper) to fabricate especially in complicated shapes, and/or have better corrosion resistance. However such polymeric parts have not replaced metals in some application because the they are not stiff and/or strong enough, or have other property deficiencies compared to metal.

Thus vehicle manufacturers have been searching for ways to incorporate more polymeric materials into their vehicles for a variety of reasons, for example to save weight, lower costs, or provide more design freedom. Thus improved polymeric vehicular electronic and electrical housings (VEEHs) have been sought by vehicle manufacturers. It has now been found that metal plated organic polymeric VEEH have the properties desired.

Metal plated polymeric parts have been used in vehicles, especially for ornamental purposes. Chrome or nickel plating of visible parts, including polymeric parts, has long been done. In this use the polymer is coated with a thin layer of metal to produce a pleasing visual effect. The amount of metal used is generally the minimum required to produce the desired visual effect and be durable.

It is well known the metal plating polymeric compositions are barriers for electromagnetic radiation (EMR), and electrical and electronic housings are sometimes made with such metal coatings, see for instance U.S. Pat. No. 7,120,005. However it is not suggested that these coatings can also materially aid the structural integrity of these housings.

U.S. Pat. No. 4,406,558 describes a gudgeon pin for an internal combustion engine which is metal plated polymer. U.S. Pat. No. 6,595,341 describes an aluminum plated plastic part for a clutch. Neither of these patents mentions VEEH.

SUMMARY OF THE INVENTION

This invention concerns a vehicular electronic or electrical housing, comprising an organic polymer composition which is coated at least in part by a metal, provided that a flexural modulus of said organic polymer composition coated by said metal is at least twice that of said organic polymer composition.

This invention concerns a vehicle comprising an electronic or electrical housing, which comprises an organic polymer composition which is coated at least in part by a metal, provided that a flexural modulus of said organic polymer composition coated by said metal is at least twice that of said organic polymer composition.

DETAILS OF THE INVENTION

Herein certain terms are used and some of them are defined below:

By an "organic polymer composition" is meant a composition which comprises one or more organic polymers. Preferably one or more of the organic polymers is the continuous phase.

By an "organic polymer" (OP) is meant a polymeric material which has carbon-carbon bonds in the polymeric chains and/or has groups in the polymeric chains which have carbon bound to hydrogen and/or halogen. Preferably the organic polymer is synthetic, i.e., made by man. The organic polymer may be for example a thermoplastic polymer (TPP), or a thermoset polymer (TSP).

By a "TPP" is meant a polymer which is not crosslinked and which has a melting point and/or glass transition point above 30° C., preferably above about 100° C., and more preferably above about 150° C. The highest melting point and/or glass transition temperature is also below the point where significant thermal degradation of the TPP occurs. Melting points and glass transition points are measured using ASTM Method ASTM D3418-82. The glass transition temperature is taken at the transition midpoint, while the melting point is measured on the second heat and taken as the peak of the melting endotherm.

By a "TSP" is meant a polymeric material which is crosslinked, i.e., is insoluble in solvents and does not melt. It also refers to this type of polymeric material before it is crosslinked, but in the final VEEH, it is crosslinked. Preferably the crosslinked TSP composition has a Heat Deflection Temperature of about 50° C., more preferably about 100° C., very preferably about 150° C. or more at a load of 0.455 MPa (66 psi) when measured using ASTM Method D648-07.

By a polymeric "composition" is meant that the organic polymer is present together with any other additives usually used with such a type of polymer (see below).

By "coated with a metal" is meant part or all of one or more surfaces of the VEEH is coated with a metal. The metal does not necessarily directly contact a surface of the organic polymer composition. For example an adhesive may be applied to the surface of the organic polymer and the metal coated onto that. Any method of coating the metal may be used (see below).

By "metal" is meant any pure metal or alloy or combination of metals. More than one layer of metal may be present, and the layers may have the same or different compositions.

There are many electronic and electrical components in vehicles which carry out various functions. Many of these are housed in VEEHs for convenience in having these particular components in one place and/or to protect them from the environment. In some cases the housings are also used to prevent electromagnetic radiation (ER) from emanating from and/or going into the electronic or electrical equipment. This ER shielding can be accomplished by use of a metal layer on the housing.

However VEEHs must often perform other functions. For example, they may be part of another larger structure, so they must have some minimum stiffness and/or strength. They have to withstand dynamic forces from vehicle movement and prevent their contents from shifting. Thus such housings must be sometimes be more than simple containers.

Such housings may be made from metal which has inherent shielding characteristics and is strong and stiff, but it is also electrically conductive which may be a disadvantage. Plastic compositions, on the other hand, are usually electrically non-conducting, but unless relatively thick are not so strong and/or stiff. Metal coated VEEHs may be relatively lightweight while still be relatively strong and stiff and be relatively easy to fabricate. In addition, if the housing is (almost) completely metal coated an EMR barrier is formed. However in order to significantly improve physical properties such as stiffness and strength, the thickness of the metal layer must be significantly larger than that usually use for EMR shielding. Thus the flexural modulus of the metal coated OP composition should be at least twice that of the uncoated OP, more preferably at least thrice that of the uncoated OP (see below for test procedure).

The metal coating of VEEH may also aid in heat dissipation. For example is an electrical or electronic component which generates a lot of heat is located near a wall of the VEEH the section of wall may become quite hot. However, because generally the thermal conductivity of metals is much higher than polymers, the metal coating will conduct some of the heat away from that section of the wall, thereby lowering the temperature of that section.

If EMR shielding is not needed the VEEH need not be completely metal coated. It may be coated in such a way so as to increase the desired physical property where it is needed. For instance if the VEEH is a rectangular solid, strips of metal coating diagonally between opposite corners of the housing may suffice to increase stiffness. Other useful patterns will be apparent to the designer.

The VEEH may have a one or more hinged or detachable covers and/or ports, to allow access to the interior of the VEER. These ports/covers may also be metal coated. The VEEH may be metal coated on the interior and/or exterior surfaces.

Useful TSPs include epoxy, phenolic, and melamine resins. Parts may be formed from the thermoset resin by conventional methods such as reaction injection molding or compression molding.

Useful TPPs include poly(oxymethylene) and its copolymers; polyesters such as poly(ethylene terephthalate), poly(1,4-butylene terephthalate), poly(1,4-cyclohexyldimethylene terephthalate), and poly(1,3-poropyleneterephthalate); polyamides such as nylon-6,6, nylon-6, nylon-12, nylon-11, and aromatic-aliphatic co-polyamides; polyolefins such as polyethylene (i.e. all forms such as low density, linear low density, high density, etc.), polypropylene, polystyrene, polystyrene/poly(phenylene oxide) blends, polycarbonates such as poly(bisphenol-A carbonate); fluoropolymers including perfluoropolymers and partially fluorinated polymers such as copolymers of tetrafluoroethylene and hexafluoropropylene, poly(vinyl fluoride), and the copolymers of ethylene and vinylidene fluoride or vinyl fluoride; polysulfides such as poly(p-phenylene sulfide); polyetherketones such as poly(ether-ketones), poly(ether-ether-ketones), and poly(ether-ketone-ketones); poly(etherimides); acrylonitrile-1,3-butadinene-styrene copolymers; thermoplastic (meth)acrylic polymers such as poly(methyl methacrylate); and chlorinated polymers such as poly(vinyl chloride), polyimides, polyamideimides, vinyl chloride copolymer, and poly(vinylidene chloride). "Thermotropic liquid crystalline polymer" (LCP) herein means a polymer that is anisotropic when tested using the TOT test or any reasonable variation thereof, as described in U.S. Pat. No. 4,118,372, which is hereby incorporated by reference. Useful LCPs include polyesters, poly(ester-amides), and poly(ester-imides). One preferred form of LCP is "all aromatic", that is all of the groups in the polymer main chain are aromatic (except for the linking groups such as ester groups), but side groups which are not aromatic may be present. The TPPs may be formed into parts by the usual methods, such as injection molding, thermoforming, compression molding, extrusion, and the like.

The OP, whether a TSP, TPP or other polymer composition may contain other ingredients normally found in such compositions such as fillers, reinforcing agents such as glass and carbon fibers, pigments, dyes, stabilizers, toughening agents, nucleating agents, antioxidants, flame retardants, process aids, and adhesion promoters. Another class of materials may be substances that improve the adhesion to the resin of the metal to be coated onto the resin. Some of these may also fit into one or more of the classes named above.

The OP (composition) should preferably not soften significantly at the expected maximum operating temperature of the VEEH. Since it is often present at least in part for enhanced structural purposes, it will better maintain its overall physical properties if no softening occurs. Thus preferably the OP has a melting point and/or glass transition temperature and/or a Heat Deflection Temperature at or above the highest use temperature of the OP.

The OP composition (without metal coating) should also preferably have a relatively high flexural modulus, preferably at least about 1 GPa, more preferably at least about 2 GPa, and very preferably at least about 10 GPa.

Flexural modulus is measured by ASTM Method D790-03, Procedure A, preferably on molded parts, 3.2 mm thick (⅛ inch), and 12.7 mm (0.5 inch) wide, under a standard laboratory atmosphere. Since these are structural parts, and are usually preferred to be stiff, a higher flexural modulus improves the overall stiffness of the metal coated VEEH.

The OP composition may be coated with metal by any known methods for accomplishing that, such as vacuum deposition (including various methods of heating the metal to be deposited), electroless plating, electroplating, chemical vapor deposition, metal sputtering, and electron beam deposition. Preferred methods are electroless plating and electroplating, and a combination of the two. Although the metal may adhere well to the OP composition without any special treatment, usually some method for improving adhesion will be used. This may range from simple abrasion of the OP composition surface to roughen it, addition of adhesion promotion agents, chemical etching, functionalization of the surface by exposure to plasma and/or radiation (for instance laser or UV radiation) or any combination of these. Which methods may be used will depend on the OP composition to be coated and the adhesion desired. Methods for improving the adhesion of coated metals to many OPs are well known in the art. More than one metal or metal alloy may be plated onto the organic resin, for example one metal or alloy may be plated directly onto the organic resin surface because of its good adhesion, and another metal or alloy may be plated on top of that because it has a higher strength and/or stiffness.

Useful metals and alloys to form the metal coating include copper, nickel, iron-nickel, cobalt, cobalt-nickel and chromium, and combinations of these in different layers. Preferred metals and alloys are copper, nickel, cobalt, cobalt-nickel, and iron-nickel, and nickel is more preferred.

The surface of the organic resin of the structural part may be fully or partly coated with metal. In different areas of the part the thickness and/or the number of metal layers, and/or the composition of the metal layers may vary.

When electroplating it is known that grain size of the metal deposited may be controlled by the electroplating conditions, see for instance U.S. Pat. Nos. 5,352,266 and 5,433,797 and U.S. Patent Publications 20060125282 and 20050205425, all of which are hereby included by reference. In one preferred form at least one of the metal layers deposited has an average grain size in the range of about 5 nm to about 200 nm, more preferably about 10 nm to about 100 nm. In another preferred form of electroplated metal, the metal has an average grain size of at least 500 nm, preferably at least about 1000 nm, and/or has an average maximum grain size of about 5000 nm. For all these grain size preferences, it is preferred that that thickest metal layer, if there is more than one layer, be the specified grain size. The thickness of the metal layer(s) deposited on the organic resin is not critical, being determined mostly by the desire to minimize weight while providing certain minimum physical properties such as modulus, strength and/or stiffness. These overall properties will depend to a certain extent not only on the thickness and type of metal or alloy used, but also on the design of the structural part and the properties of the organic resin composition.

In one preferred embodiment the flexural modulus of the metal-coated VEEH is at least about twice, more preferably at least about thrice the flexural modulus of the uncoated OP composition. This is measured in the following way. The procedure used is ISO Method 178, using molded test bars with dimensions 4.0 mm thick and 10.0 mm wide. The testing speed is 2.0 mm/min. The composition from which the VEEHs are made is molded into the test bars, and then some of the bars are completely coated (optionally except for the ends which do not affect the test results) with the same metal using the same procedure used to coat the VEEH. The thickness of the metal coating on the bars is the same as on the VEEH. If the thickness on the VEEH varies, the test bars will be coated to the greatest metal thickness on the VEEH. The flexural moduli of the coated and uncoated bars are then measured, and these values are used to determine the ratio of flexural moduli (flexural modulus of coated/flexural modulus of uncoated). Generally speaking the thicker the metal coating, the greater the flexural modulus ratio between the uncoated and coated OP part.

For use as VEEHs, it is also important in many instances that the plated OP composition be tough, for example be able to withstand impacts. It has surprisingly been found that some of the metal plated OP compositions of the present invention are surprisingly tough. It has previously been reported (M. Corley, et al., *Engineering Polyolefins for Metallized Decorative Applications*, in *Proceedings of TPOs in Automotive 2005*, held Jun. 21-23, 2005, Geneva Switzerland, Executive Conference Management, Plymouth, Mich. 48170 USA, p. 1-6) that unfilled or lightly filled polyolefin plaques have a higher impact energy to break than their Cr plated analog. Indeed the impact strength of the plated plaques range from 50 to 86 percent of the impact strength of the unplated plaques. As can be seen from Examples 2-7 below, the impact maximum energies of the plated plaques are much higher than those of the unplated plaques. It is believed this is due to the higher filler levels of the OP compositions used, and in the present parts it is preferred that the OP composition have at least about 25 weight percent, more preferably about 35 weight percent, especially preferably at least about 45 weight percent of filler/reinforcing agent present. A preferred maximum amount of filler/reinforcing agent present is about 65 weight percent. These percentages are based on the total weight of all ingredients present. Typical reinforcing agents/fillers include carbon fiber, glass fiber, aramid fiber, particulate minerals such as clays (various types), mica, silica, calcium carbonate (including limestone), zinc oxide, wollastonite, carbon black, titanium dioxide, alumina, talc, kaolin, microspheres, alumina trihydrate, calcium sulfate, and other minerals.

It is preferred that the IS0179 impact energy (see below for procedure) of the metal plated VEEH be 1.2 times or more the impact energy of the unplated OP composition, more preferably 1.5 times or more. The test is run by making bars of the OP composition, and plating them by the same method used to make the VEEH, with the same thickness of metal applied. If the VEEH is metal plated on both sides (of the principal surfaces), the test bars are plated on both sides, while if the VEEH is plated on one side (of the principal surfaces) the test bars are plated on one side. The impact energy of the plated bars are compared to the impact energy of bars of the unplated OP composition.

Preferably the metal coating is about 0.010 mm to about 1.3 mm thick, more preferably about 0.025 mm to about 1.1 mm thick, very preferably about 0.050 to about 1.0 mm thick, and especially preferably about 0.10 to about 0.7 mm thick. It is to be understood that any minimum thickness mentioned above may be combined with any maximum thickness mentioned above to form a different preferred thickness range. The thickness required to attain a certain flexural modulus is also dependent on the metal chosen for the coating. Generally speaking the higher the tensile modulus of the metal, the less will be needed to achieve a given stiffness (flexural modulus).

Preferably the flexural modulus of the uncoated OP composition is greater than about 200 MPa, more preferably greater than about 500 MPa, and very preferably greater than about 2.0 GPa.

EXAMPLE 1

Zytel® 70G25, a nylon 6,6 product containing 25 weight percent chopped glass fiber available from E.I. DuPont de Nemours & Co., Inc. Wilmington, Del. 19898 USA, was injection molded into bars whose central section was 10.0 mm wide and 4.0 mm thick. Before molding the polymer composition was dried at 80° C. in a dehumidified dryer. Molding conditions were melt temperature 280-300° C. and a mold temperature of 80° C. Some of the bars were etched using Addipost® PM847 etch, reported to be a blend of ethylene glycol and hydrochloric acid, and obtained from Rohm & Haas Chemicals Europe. Less than 1 μm of copper was then electrolessly deposited on the surface, followed by 8 μm of electrolytically deposited copper, followed by 100 μm of nickel, on all surfaces. The flexural modulus was then determined, as described above, on the uncoated and metal coated bars. The uncoated bars had a flexural modulus of 7.7 GPa, and the metal coated bars had a flexural modulus of 29.9 GPa.

EXAMPLES 2-7

Ingredients used, and their designations in the tables are:

Filler 1—A calcined, aminosilane coated, kaolin, Polarite® 102A, available from Imerys Co., Paris, France.

Filler 2—Calmote® UF, a calcium carbonate available from Omya UK, Ltd., Derby DE21 6LY, UK.

Filler 3—Nyad® G, a wollastonite from Nyco Minerals, Willsboro, N.Y. 12996, USA.

Filler 4—M10-52 talc manufactured by Barretts Minerals, Inc., Dillon, Mont., USA.

Filler 5—Translink® 445, a treated kaolin available from BASF Corp., Florham Park, N.J. 07932, USA.

GF 1—Chopped (nominal length 3.2 mm) glass fiber, PPG® 3660, available from PPG Industries, Pittsburgh, Pa. 15272, USA.

GF 2—Chopped (nominal length 3.2 mm) glass fiber, PPG® 3540, available from PPG Industries, Pittsburgh, Pa. 15272, USA.

HS1—A thermal stabilizer containing 78% KI, 11% aluminum distearate, and 11% CuI (by weight).

HS2—A thermal stabilizer contain 7 parts KI, 11 parts aluminum distearate, and 0.5 parts CuI (by weight).

Lube—Licowax® PE 190—a polyethylene wax used as a mold lubricant available from Clariant Corp. Charlotte, N.C. 28205, USA.

Polymer A—Polyamide-6,6, Zytel® 101 available from E.I. DuPont de Nemours & Co., Inc. Wilmington, Del. 19810, USA.

Polymer B—Polyamide-6, Durethan® B29 available from Laxness AG, 51369 Leverkusen, Germany.

Polymer C—An ethylene/propylene copolymer grafted with 3 weight percent maleic anhydride.

Polymer D—A copolyamide which is a copolymer of terephthalic acid, 1,6-diaminohexane, and 2-methyl-1,5-diaminopentane, in which each of the diamines is present in equimolar amounts.

Polymer E—Engage®8180, an ethylene/1-octene copolymer available by Dow Chemical Co., Midland, Mich., USA.

Wax 1—N,N'-ethylene bisstearamide

Wax 2—Licowax® OP, available from Clariant Corp. Charlotte, N.C. 28205, USA.

The organic polymer compositions used in these examples are listed in Table 1. The compositions were made by melt blending of the ingredients in a 30 mm Werner & Pfleiderer 30 mm twin screw extruder.

TABLE 1

| | Ex. | | | | | |
|---|---|---|---|---|---|---|
| | 2 | 3 | 4 | 5 | 6 | 7 |
| Polymer A | | | | | | 58.38 |
| Polymer B | | | 59.61 | | | |
| Polymer C | 2.00 | 0.90 | | 5.00 | 16.90 | 8.44 |
| Polymer D | 55.00 | 35.97 | | 34.32 | 46.95 | |
| Polymer E | 3.00 | 1.10 | | | | |
| Color concentrate | | 1.00 | | | | |
| Filler 1 | | | | 6.00 | 29.25 | 16.25 |
| Filler 2 | | | 25.00 | | | |
| Filler 3 | | 15.00 | | | | |
| Filler 4 | | 0.35 | | | | |
| Filler 5 | 40.00 | | | | | |
| GF 1 | | 45.00 | | 54.00 | 3.25 | 16.25 |
| GF 2 | | | 15.00 | | | |
| HS1 | | 0.43 | | 0.43 | 0.43 | 0.43 |
| HS2 | | 0.09 | | | | |
| Lube | | | | 0.25 | 0.25 | 0.25 |
| Wax 1 | | 0.30 | | | | |
| Wax 2 | | 0.25 | | | | |

The test pieces, which were 7.62×12.70×0.30 cm plaques or ISO 527 test bars, 4 mm thick, gauge width 10 mm, were made by injection molding under the conditions given in Table 2. Before molding the polymer compositions were dried for 6-8 hr in dehumidified air under the temperatures indicated, and had a moisture content of <0.1% before molding.

TABLE 2

| Ex. | Drying Temp., ° C. | Melt Temp., ° C. | Mold Temp., ° C. |
|---|---|---|---|
| 2 | 100 | 320-330 | 140-160 |
| 3 | 100 | 320-330 | 140-160 |
| 4 | 80 | 210-230 | 80 |
| 5 | 100 | 320-330 | 140-160 |
| 6 | 100 | 320-330 | 140-160 |
| 7 | 100 | 320-330 | 140-160 |

These test specimens were then etched in sulfochromic acid or Rohm & Haas Chrome free etching solution, and rendered conductive on all surface by electroless deposition of a very thin layer of Ni. Subsequent galvanic deposition of 8 µm of Cu was followed by deposition of a 100 µm thick layer of fine-grained Ni—Fe 45-55% Fe by weight) using a pulsed electric current, as described in U.S. Pat. No. 5,352,266 for making fine grain size metal coatings.

The samples were tested by one or both of the following methods:

ISO 6603-2—Machine Instron® Dynatup Model 8250, Support Ring 40 mm dia, Hemispherical Tup 20 mm dia, Velocity 2.2 m/s, Impacter weight 44.45 kg, Temperature 23° C., Condition dry as made. Test were run on the plaques described above.

ISO 179-1eU—Sample Unnotched, Pendulum energy 25 J, Impact velocity 3.7 m/s, Temperature 23° C., Condition dry as made. Tests were run on the gauge part of the ISO 527 test bars described above.

Testing results are given in Table 3.

TABLE 3

| | ISO 6603-2 | | | | | |
|---|---|---|---|---|---|---|
| | Maximum Energy, J | | Maximum Load, kN | | ISO 179 kJ/m$^2$ | |
| Ex. | Unplated | Ni—Fe Plated | Unplated | Ni—Fe Plated | Unplated | Ni—Fe Plated |
| 2 | | | | | 90.4 | 109 |
| 3 | 2.5 | 6.8 | 1.0 | 2.7 | 50.2 | 100 |
| 4 | 2.3 | 16.2 | 0.9 | 5.0 | 60.3 | 129 |
| 5 | 10.0 | 15.0 | 2.6 | 4.0 | 53.6 | 108 |
| 6 | 8.5 | 23.3 | 1.8 | 4.7 | 40.7 | 87 |
| 7 | 7.8 | 24.3 | 2.3 | 6.8 | | |

What is claimed is:

1. A vehicular electronic or electrical housing, comprising an organic polymer composition which is coated at least in part only on its surface by a metal, provided that a flexural modulus of said organic polymer composition coated by said metal is at least twice that of said organic polymer composition
    wherein the polymer composition includes a reinforcing agent ranging from 25% to 65% by weight of the organic polymer composition,
    wherein said metal coating provided on the surface is 0.010 mm to 1.3 mm thick and includes at least two layers, at least one layer of said metal coating has an average grain size of 5nm to 200 nm, and
    wherein an impact energy according to ISO 0179 of a metal coated section of the organic polymer composition is at least 1.5 times an impact energy of an uncoated section of the organic polymer composition.

2. The vehicular electronic or electrical housing as recited in claim 1 wherein said organic polymer composition is one of a thermoplastic and thermoset, wherein said organic polymer composition, if a thermoplastic, has a melting point and/or a glass transition point of 100° C. or more, or, if a thermoset, has a heat deflection temperature of 100° C. or more at a load of 0.455 MPa.

3. The vehicular electronic or electrical housing as recited in claim 1 wherein said electronic or electrical housing is metal coated on at least one of the exterior surface and interior surface of said electronic or electrical housing.

4. The vehicular electronic or electrical housing as recited in claim 1 wherein a thickest layer of said metal coating has an average grain size of at least 500 nm to 5,000 nm.

5. The vehicular electronic or electrical housing as recited in claim 1 wherein said metal coating is 0.025 mm to 1.3 mm thick.

6. The vehicular electronic or electrical housing of claim 1, wherein a flexural modulus of a metal coated section of the organic polymer composition is at least 2 times a flexural modulus of an uncoated section of the organic polymer composition.

7. The vehicular electronic or electrical housing of claim 6, wherein the flexural modulus of the metal coated section of the organic polymer composition is at least 3 times the flexural modulus of the uncoated section of the organic polymer composition.

8. The vehicular electronic or electrical housing of claim 6, wherein the flexural modulus of the uncoated section of the organic polymer composition is greater than 200 MPa.

9. The vehicular electronic or electrical housing of claim 6, wherein the flexural modulus of the uncoated section of the organic polymer composition is greater than 500 MPa.

10. The vehicular electronic or electrical housing of claim 6, wherein the flexural modulus of the uncoated section of the organic polymer composition is greater than 2.0 GPa.

11. The vehicular electronic or electrical housing of claim 1, wherein the reinforcement agent is one of a glass fiber and a carbon fiber.

12. The vehicular electronic or electrical housing of claim 1, comprising a polyamide optionally containing one or more additives selected from the group consisting of fillers, reinforcing agents, pigments, dyes, stabilizers, toughening agents, nucleation agents, antioxidants, flame retardants, process aids, and adhesion promoters.

13. The vehicular electronic or electrical housing of claim 1, comprising a metallic material comprising at least one element selected from the group consisting of copper, cobalt, iron and nickel.

14. The vehicular electronic or electrical housing of claim 1, wherein said metallic coating has a total thickness ranging from 10 microns to 0 7 mm and contains a layer comprising Cu having a total thickness of up to 9 microns and at least one layer comprising Ni.

15. The vehicular electronic or electrical housing of claim 14, wherein said metallic coating has a total thickness ranging from about 50 microns to about 100 microns.

16. A vehicular electronic or electrical housing comprising:
an organic polymer composition having an exterior surface and an interior surface each of which is coated at least in part by a metal having a microstructure which is fine-grained, wherein said metal coating contains a layer comprising Cu and at least one layer comprising Ni having a total thickness of up to 100 microns,
wherein the organic polymer composition includes a reinforcing agent which is at least 25% by weight of the organic polymer composition,
wherein an impact energy according to ISO 0179 of a metal coated section of the organic polymer composition is at least 1.5 times an impact energy of an uncoated section of the organic polymer composition, and
wherein a flexural modulus of the uncoated section of the organic polymer composition is at least 2 times the flexural modulus of the uncoated section of the organic polymer composition.

17. The vehicular electronic or electrical housing of claim 16, wherein a flexural modulus of the uncoated section of the organic polymer composition is greater than 200 MPa.

18. The vehicular electronic or electrical housing of claim 16, wherein the organic polymer composition includes a reinforcing agent including one of a glass fiber and a carbon fiber, the reinforcing agent ranging from 25% to 65% by weight of the organic polymer composition.

19. The vehicular electronic or electrical housing of claim 16, wherein the layer comprising Cu has a total thickness of up to 9 microns.

\* \* \* \* \*

UNITED STATES PATENT AND TRADEMARK OFFICE
CERTIFICATE OF CORRECTION

PATENT NO. : 8,367,170 B2  Page 1 of 1
APPLICATION NO. : 12/681355
DATED : February 5, 2013
INVENTOR(S) : Andri E. Elia et al.

It is certified that error appears in the above-identified patent and that said Letters Patent is hereby corrected as shown below:

In the Claims:

Col. 10, line 3, Claim 14, replace the number "0 7" with the number --0.7--.

Signed and Sealed this
Thirtieth Day of July, 2013

Teresa Stanek Rea
*Acting Director of the United States Patent and Trademark Office*